(12) United States Patent
Larsen et al.

(10) Patent No.: US 8,432,148 B2
(45) Date of Patent: Apr. 30, 2013

(54) APPARATUS AND METHOD FOR A SMOOTH POWERUP OF A REFERENCE SIGNAL

(75) Inventors: Christian Larsen, Irvine, CA (US); Gomathi Komanduru, Irvine, CA (US); Lorenzo Crespi, Costa Mesa, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 13/525,071

(22) Filed: Jun. 15, 2012

(65) Prior Publication Data

US 2012/0313712 A1    Dec. 13, 2012

Related U.S. Application Data

(63) Continuation of application No. 12/860,791, filed on Aug. 20, 2010, now Pat. No. 8,212,608.

(51) Int. Cl.
    *G05F 3/16* (2006.01)
    *G05F 3/20* (2006.01)

(52) U.S. Cl.
    USPC ............ 323/315; 327/538; 327/540; 323/312

(58) Field of Classification Search .................. 327/530, 327/538–543, 546; 323/312–317
    See application file for complete search history.

(56) References Cited

U.S. PATENT DOCUMENTS

| | | | |
|---|---|---|---|
| 6,140,868 A * | 10/2000 | Shoaei et al. ................. | 327/561 |
| 6,538,496 B1 | 3/2003 | Tanase | |
| 6,775,387 B1 | 8/2004 | Mavencamp et al. | |
| 6,819,165 B2 | 11/2004 | Ho et al. | |
| 7,573,252 B1 | 8/2009 | Griesert | |
| 2006/0012451 A1 * | 1/2006 | De Cremoux ................. | 333/216 |
| 2007/0030709 A1 | 2/2007 | Kitagawa | |
| 2008/0018385 A1 * | 1/2008 | Ureshino ....................... | 327/540 |
| 2009/0009236 A1 * | 1/2009 | Saitoh ........................... | 327/541 |
| 2010/0007536 A1 | 1/2010 | Tokumaru et al. | |
| 2010/0176875 A1 | 7/2010 | Pulijala et al. | |
| 2011/0156822 A1 | 6/2011 | Takano et al. | |

FOREIGN PATENT DOCUMENTS

| | | |
|---|---|---|
| GB | 2441361 | 5/2008 |
| WO | 2007005380 | 1/2007 |

OTHER PUBLICATIONS

European Patent Office, International Search Report and Written Opinion; PCT Application No. PCT/US2011/048122; Nov. 7, 2011.
European Patent Office, International Preliminary Report on Patentability; PCT Application No. PCT/US2011/048122; Mar. 7, 2013.

* cited by examiner

*Primary Examiner* — Lincoln Donovan
*Assistant Examiner* — Brandon S Cole
(74) *Attorney, Agent, or Firm* — Jackson Walker L.L.P.; Christopher J. Rourk

(57) ABSTRACT

A circuit for providing a reference voltage can be widely used in audio applications. However, at startup an abrupt start in the reference signal can cause undesirable audible artifacts. A circuit employing feedback of a reference voltage to control the charging of a capacitor which provides the reference voltage can be used to provide a smooth startup to the reference voltage. The circuit contains a differential pair for steering a fixed current source from one path to another as the reference voltage increases. The steered current can then be mirrored into one ore more current mirrors where the newly mirrored current can be squeezed to zero when the difference between a desired reference voltage and the reference voltage approaches zero. This newly mirrored current can be used to charge a capacitor which is used to provide the reference voltage.

21 Claims, 7 Drawing Sheets

APPARATUS AND METHOD FOR A SMOOTH POWERUP OF A REFERENCE SIGNAL

CROSS-REFERENCE TO RELATED APPLICATION

The present application is a continuation of U.S. Ser. No. 12/860,791, filed Aug. 20, 2010, now U.S. Pat. No. 8,212,608 entitled, "APPARATUS AND METHOD FOR A SMOOTH POWERUP OF A REFERENCE SIGNAL" which is hereby incorporated by reference for all purposes.

TECHNICAL FIELD

This invention relates generally to audio systems and specifically with circuits and methods to generate a smooth transition from low supply voltage to a nominal reference voltage.

BACKGROUND

A pop is an undesirable audio artifact introduced in an audio system during power up. Generally, when an audio circuit is powered up there is a step in the supply and particularly to the reference voltage supplied to audio amplifiers. This discontinuity manifests itself as a pop sound which can be heard by the listener. Because a discontinuity is spectrally broad, it is especially undesirable.

Many techniques have been employed to address the pop problem. One method is to suppress the pop at the output, by suppressing any output while the audio system powers up. Another method is to isolate the most vulnerable portion of the audio system to pop from the output. Still others have employed charging a capacitor to generate a piecewise continuous reference voltage.

SUMMARY OF INVENTION

Embodiments of the invention provide a reference voltage, but have a smooth power up so that the reference voltage during startup does not generate discontinuities in voltage or the slope of the voltage. One embodiment is a circuit comprising a capacitor which provides the reference voltage, a differential pair with one input coupled to the reference voltage and the second input coupled to predetermined voltage. As the reference voltage increases, current is steered away from the current path controlled by the first input into the current path controlled by the second input. The circuit further comprises a current mirror which mirrors the current flowing through the current path controlled by the second input of the differential pair. The mirrored current is used to charge the capacitor completing a positive feedback loop. The output path of the current mirror is coupled to a desired reference voltage source and the reference voltage so that when the reference voltage approaches the desired reference voltage, the voltage across the output path of the current mirror approaches zero, squeezing the current flowing through the output path down to zero, thus halting the feedback.

The circuit can also comprise a current source which drives the differential pair. Once activated the current source begins the positive feedback through the differential pair and current mirror. Optionally, a second current mirror can be used to buffer the current between the differential pair and the current mirror coupled to the capacitor.

Specific implementations of the current source can comprise a field effect transistor (FET) coupled to a fixed bias voltage. Implementations of the differential pair can comprise a pair of FETs, such as p-channel FETs (PFETs). Implementations of the current mirrors can comprise a pair of FETs either n-channel FETs (NFETs) or PFETs.

A corresponding method of powering up a reference voltage smoothly comprises dividing a fixed current between a first current path and a second current path, directing more current to the second current path as the reference voltage increases, mirroring the current flowing through the second current path, but squeezing that current to zero as the reference voltage approaches the desired reference voltage, and charging a capacitor using the mirrored current where the capacitor provides the reference voltage. The mirroring step can also comprise first mirroring the current flowing through the second path into an intermediate current and then mirroring the intermediate current into the capacitor while squeezing that current to zero as the reference voltage approaches the desired reference voltage.

The reference circuit can be used as a ground reference for an audio amplifier within an audio driver. The smooth ramp up of the reference circuit prevents an audible pop in the audio driver. Such an audio driver can be an integral part of many electronic devices including but not limited to personal computer sound cards, voice-over-IP telephones, cellular telephones, digital picture frames, universal serial bus headsets, televisions, video game consoles, MP3 players and Bluetooth headsets.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1:
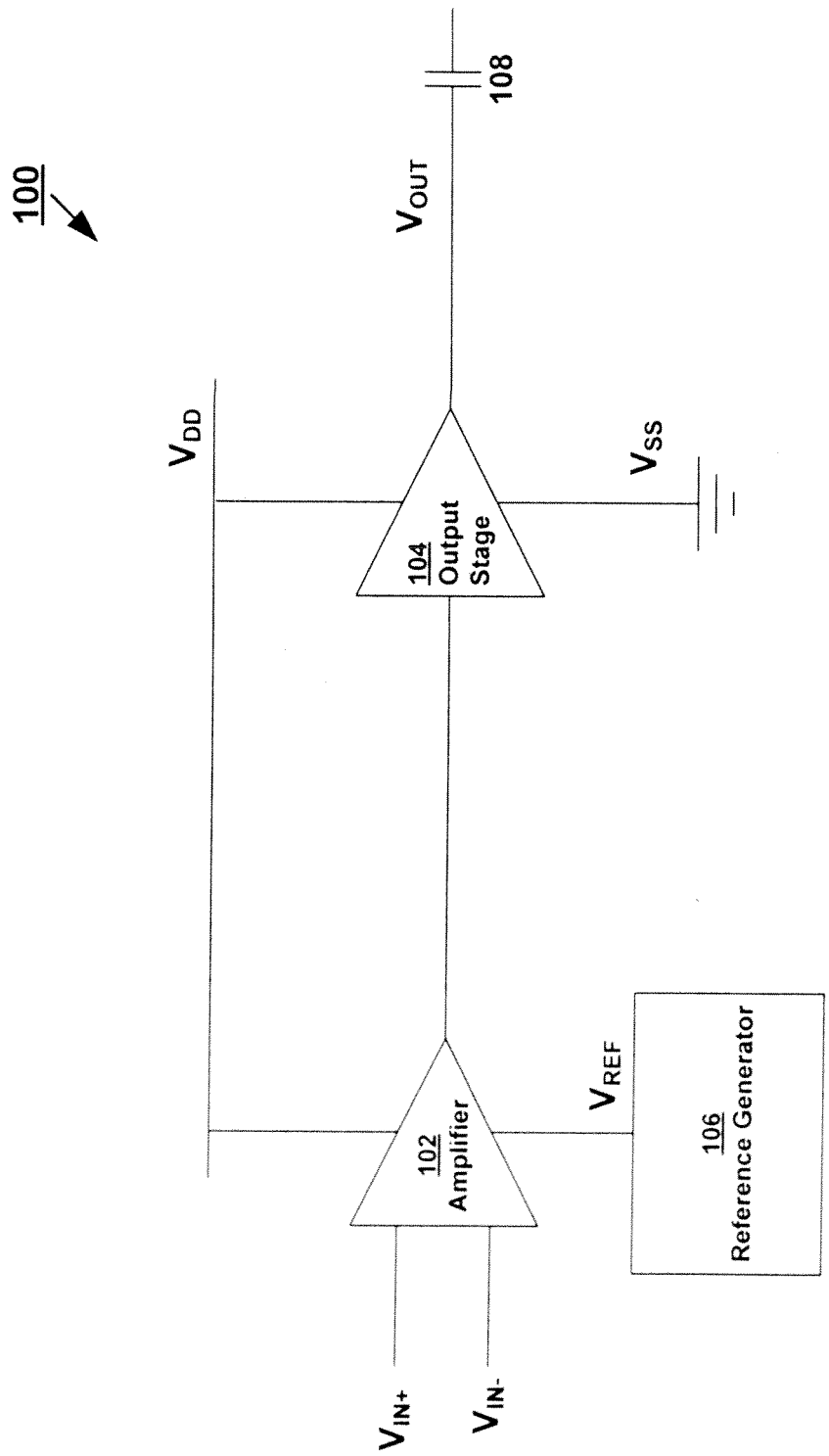
FIG. 1 shows an embodiment of an audio driver comprising a two-stage amplifier.

FIG. 1 shows an embodiment of an audio driver comprising a two-stage amplifier. The audio driver can also include audio processing elements and a digital to analog converter (DAC). The two-stage amplifier comprises amplifier 102 and output stage 104. Most audio output devices expect a zero common mode voltage, that is, the audio signal swing between positive and negative voltages with a generally zero average voltage. However it is desirable for the audio driver to only use voltages between $V_{SS}$ (typically ground) and $V_{DD}$ so that a negative supply voltage is not needed. As a result, audio drivers usually produce an output with a common mode voltage at the midpoint between $V_{DD}$ and $V_{SS}$, which would allow for the maximum voltage swing in the output signal. This introduces a DC offset to the output which for prolonged use could damage a speaker which is being driven by the audio driver. For this reason often a large capacitor such as capacitor 108 is placed in series with the audio output to filter out the DC offset.

One method to obtain a common mode voltage of $V_{REF}$ is to use the reference voltage, generated by reference generator 106, as a virtual ground to amplifier 102. If the desired reference voltage $V_{DREF}$ is selected as the midpoint between $V_{DD}$ and $V_{SS}$, the output signal can swing between $V_{DD}$ and $V_{SS}$ and have a DC offset of $V_{REF}$. The problem with this configuration is that when the audio driver is first powered up, the output voltage is at $V_{SS}$, but ramps up to the "virtual zero" of $V_{REF}$. If this transition is abrupt, it causes an audible pop. As a result, it is desirable to smoothly increase $V_{REF}$ from $V_{SS}$ to a desired final reference voltage $V_{DREF}$. If this increase experiences discontinuities in the voltage or derivatives of the voltage, an audible pop can be heard.

Figure 2:
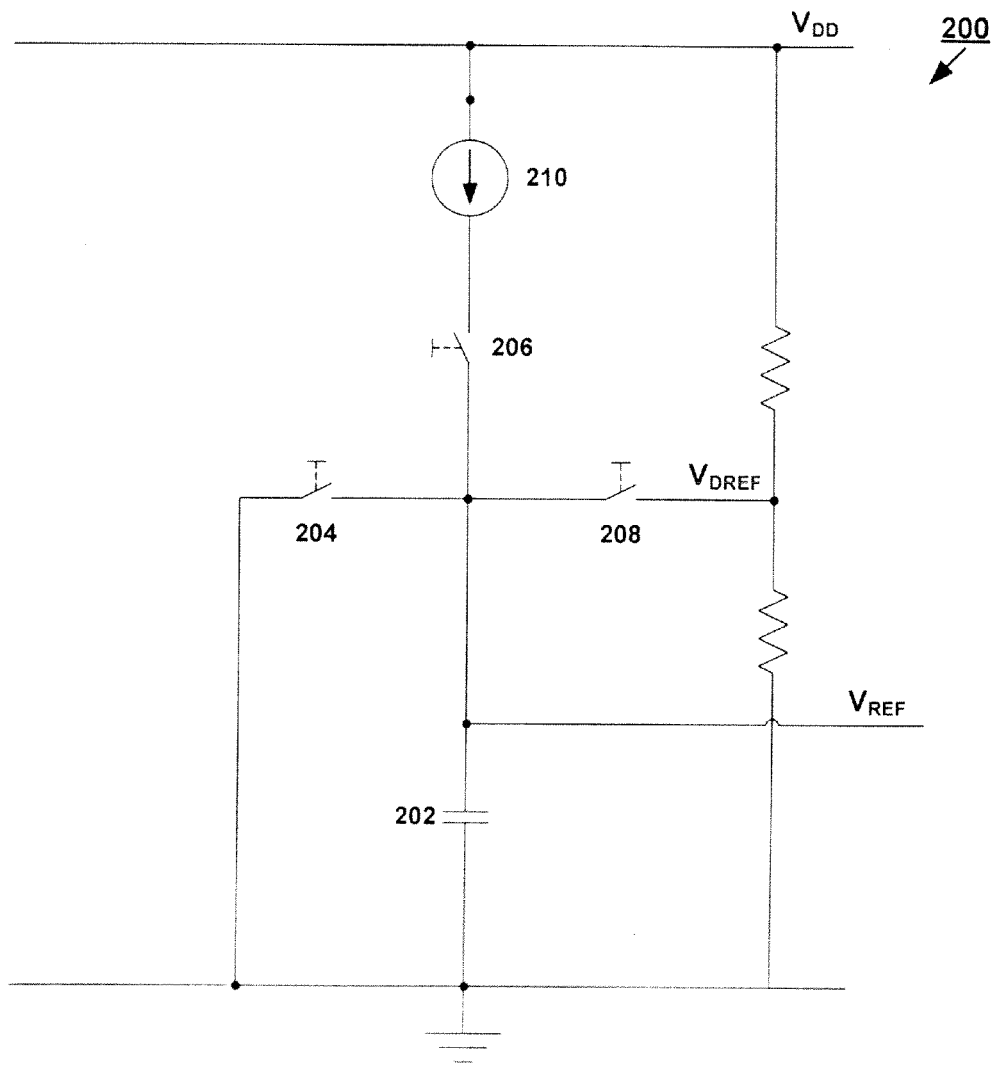
FIG. 2 is a circuit that can be used to generate a reference voltage at the startup of an audio system.

FIG. 2 is an embodiment of a reference voltage generator. Reference voltage generator 200 comprises capacitor 202, which can be connected through switches 204, 206 and 208 to three different circuits representing three different phases of the startup. The voltage across capacitor 202 furnishes the reference voltage. During the initial stage, switch 204 is closed and the capacitor is grounded (or equivalently connected to a low supply voltage $V_{SS}$). At this time any charge stored in capacitor 202 is discharged and the reference voltage is set to ground (or $V_{SS}$). At the start of power up, switch 204 is opened as switch 206 is closed. In this state, current source 210 charges capacitor 202 and the reference voltage increases linearly. When the reference voltage is near the desired reference level, switch 206 is opened and switch 208 is closed. Capacitor 202 is connected to a voltage divider comprising resistor 212 and resistor 214. The voltage increases now as an RC circuit, that is, so the voltage now asymptotically reaches the desired reference level (shown in the example as $V_{DREF}$).

Figure 3:
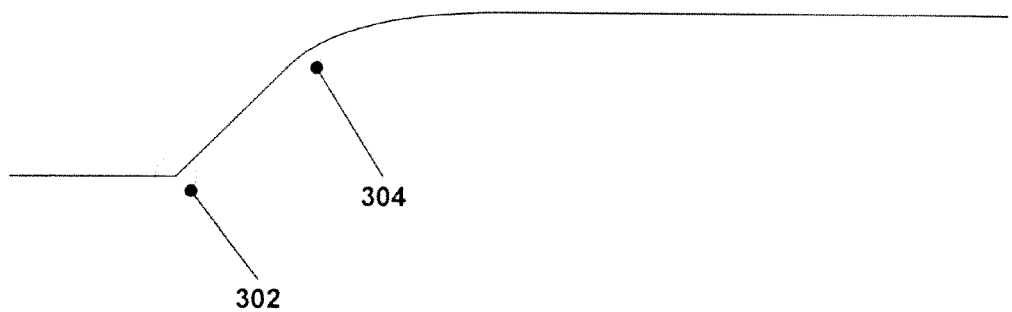
FIG. 3 is a graph showing the reference voltage as a function of time.

FIG. 3 is a graph showing the reference voltage as a function of time. At 302, switch 204 is opened and switch 206 is closed allowing for the linear increase in the voltage. At time 304, switch 206 is opened and switch 208 is closed so the voltage now increases asymptotically towards the desired reference level.

Figure 4:
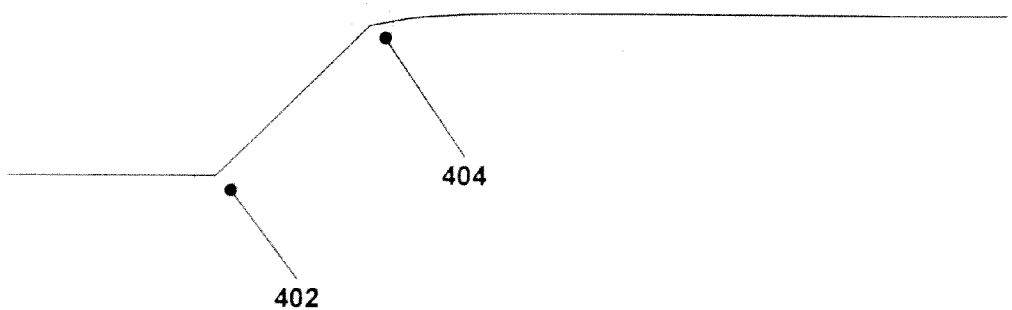
FIG. 4 is a graph showing the reference voltage as a function of time when control switches are opened and closed too late.

At 302 (or at 402 in FIG. 4), there is a discontinuity in the first derivative of the reference voltage which can still have the undesirable spectral artifacts found in a step discontinuity. Also if the timing of the opening of switch 206 and closing of switch 208 is not precise, the slopes of the linear and the asymptotic portions of the reference voltage curve will not match, leading to another discontinuity in the first derivative as shown in FIG. 4. Specifically at 404, the transition from the linear to the asymptotic portions of the voltage reference is made late.

Based on the current supplied by current source 210, the capacitance of capacitor 202 and the resistances of resistor 212 and 214, the precise voltage where the slopes of the linear portion and the asymptotic portion are equal can be determined. The reference voltage needs to be monitored and once the reference voltage reaches this determined voltage, switch 206 can be opened and switch 208 can be closed. A voltage comparator and a voltage divider can be used to make this comparison. However, due to variations due to process, voltage and temperature, the precise voltage may not be easily determined leading to a small discontinuity in the first derivative at 404.

Figure 5:
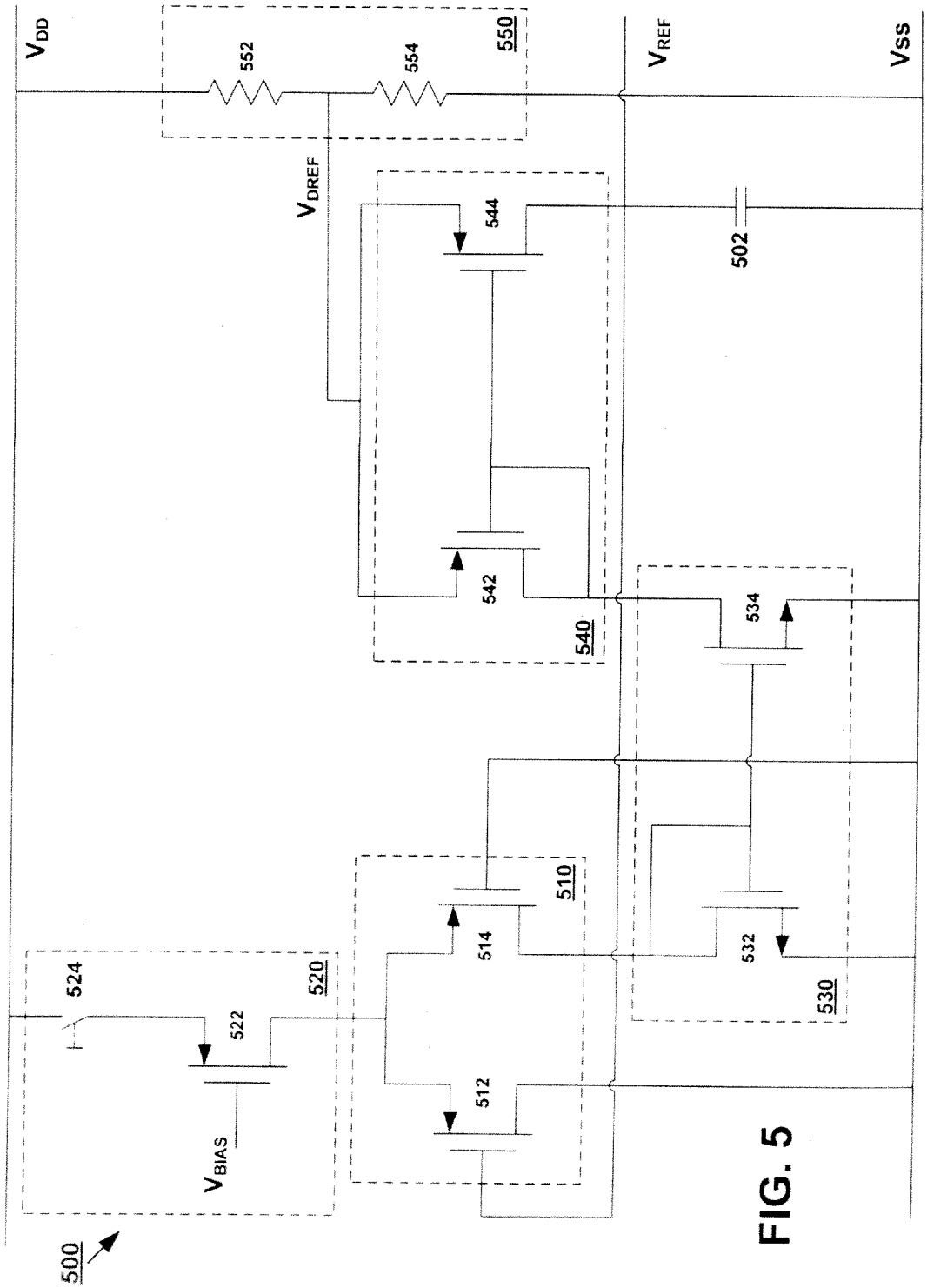
FIG. 5 shows another embodiment of circuit used to smoothly generate a ramp signal.

FIG. 5 shows another embodiment of a reference voltage generator. Reference voltage generator 500 comprises capacitor 502, differential pair 510, current source 520, current mirror 530 and current mirror 540, and desired reference voltage source 550 Like in reference voltage generator 200, capacitor 502 is used to hold the reference voltage. Differential pair 510 is shown comprising PFET 512 and PFET 514, with one input tied to ground (or $V_{SS}$). The other input is tied to the reference voltage. Current source 520 is shown comprising PFET 522 connected to a bias voltage. Current mirror 530 is shown comprising NFET 532 and NFET 534. Current mirror 540 is shown comprising PFET 542 and PFET 544, with an output coupled to capacitor 502. Desired reference voltage source 550 provides a desired reference voltage. In the example shown here, desired reference voltage source 550 is shown as provided by a voltage divider having resistors 552 and 554. However, desired reference voltage source can be a bandgap voltage, or a voltage divider having resistors and a buffer.

Initially, reference voltage generator 500 is activated by activating current source 520 such as by closing switch 524. When current source 520 is activated current flows through the differential pair through PFET 512 and PFET 514. The proportion of the current flowing through each PFET depends on the inherent resistance of each PFET and the voltage difference. In order to minimize the initial discontinuity in the slope, it is desirable for most of the current initially to flow through PFET 512. By doing so, the amount of current used to charge capacitor 502 is small, because the current through PFET 514 is mirrored through current mirrors 530 and 540, the latter current mirror charges capacitor 502. The smaller the current, the smaller the initial discontinuity in slope. Several methods can be used to achieve this.

One method of steering current initially to PFET 512 is to bias PFET 514 to a small positive voltage rather than coupling PFET 514 to ground as shown. In this case, when the circuit is activated, the reference voltage is at the ground potential (or $V_{SS}$), so the gate of PFET 514 has a higher voltage than that of PFET 512, thus causing more current to flow through PFET 512.

Another method of steering current initially to PFET 512 is to fabricate PFET 514 with greater resistance than PFET 512. For example, PFET 512 can be fabricated as a larger PFET than PFET 514 thus creating a PFET with lower resistance than PFET 514. Additionally, both approaches can be combined by supplying a smaller PFET 514 with a small positive voltage as described above.

Once the circuit is activated, a positive feedback loop is established, because as the voltage to the gate of PFET 512 increases, more current is drawn through PFET 514 which is mirrored by current mirrors 530 and 540 into capacitor 502 causing the reference voltage to increase. By increasing the reference voltage even more current is drawn through PFET 514 as the positive feedback continues.

Once the positive feedback commences, current mirror 540 under the control of current mirror 530 and differential pair 510 charge up capacitor 502 thus increasing the reference voltage. Initially, this begins slowly, but as the current increases, the reference voltage increases more rapidly. Eventually, the reference voltage causes the current through differential pair 510 to essentially flow through the second current path (e.g., through PFET 514) which feeds current mirror 530, at this point the current used to charge capacitor 502 has reached its maximum. Current mirror 540 receives a current in its input path (i.e., through PFET 542) and provides a mirrored current in its output path (i.e., through PFET 544). However, because the voltage across the output path is the difference between the desired reference voltage and the reference voltage, as the reference voltage increases, the voltage across the output path approaches zero. The effect of the decrease in voltage is that the mirrored current gets "squeezed" to a zero current.

More specifically, current mirror 540 functions because PFET 544 is operating in the saturation region, but as the drain to source voltage decreases, which occurs as the reference voltage approaches the desired reference voltage, PFET 544 begins to operate in the linear region. In the linear region, the current provided by PFET 544 becomes proportional to the drain to source voltage which decreases as the reference voltage increases leading to less current flowing to capacitor 502 and slowing down the increase to the reference voltage. Eventually, the reference voltage achieves the desired reference voltage resulting in PFET 544 shutting off completely as the drain and source voltage becomes the same.

Figure 6:
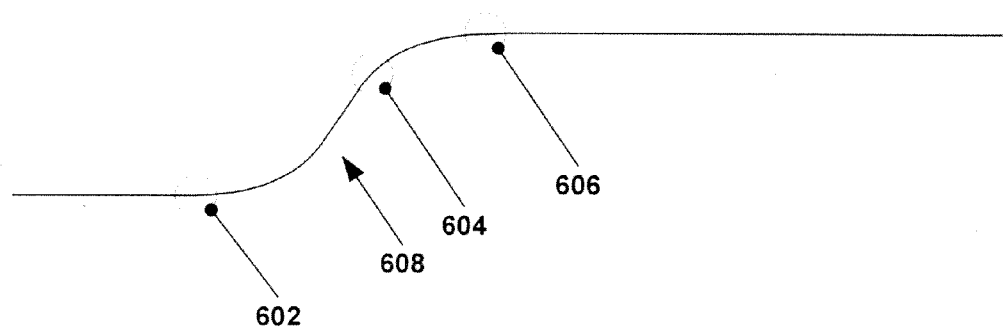
FIG. 6 shows a time line of the reference voltage.

FIG. 6 shows a time line of the reference voltage. At 602, current source 520 is activated resulting in possibly a very small jump. Since this jump is very small, the effect is a near smooth increase in the reference voltage eliminating the corner shown at 302 in FIG. 3. The reference voltage continues to increase, but begins to slow down at 604 where the reference voltage begins to approach the desired reference voltage. At 606, the desired reference voltage is attained. It should also be noted that slope at 608 is determined by the amount of current flowing through capacitor 502 once the differential pair has steered essentially all of the current through its second current path. The greater the current, the steeper the slope and the faster the rise time to reach the desired reference voltage.

In another embodiment, the slope and hence the rise time can be made adjustable. One method is to use an adjustable current source for current source 510. The more current the current source permits, the greater the current used to charge the capacitor and hence the faster the rise time to reach the desired reference voltage. Another method is to use an adjustable current mirror for either current mirror 530 or current mirror 540.

Figure 7:
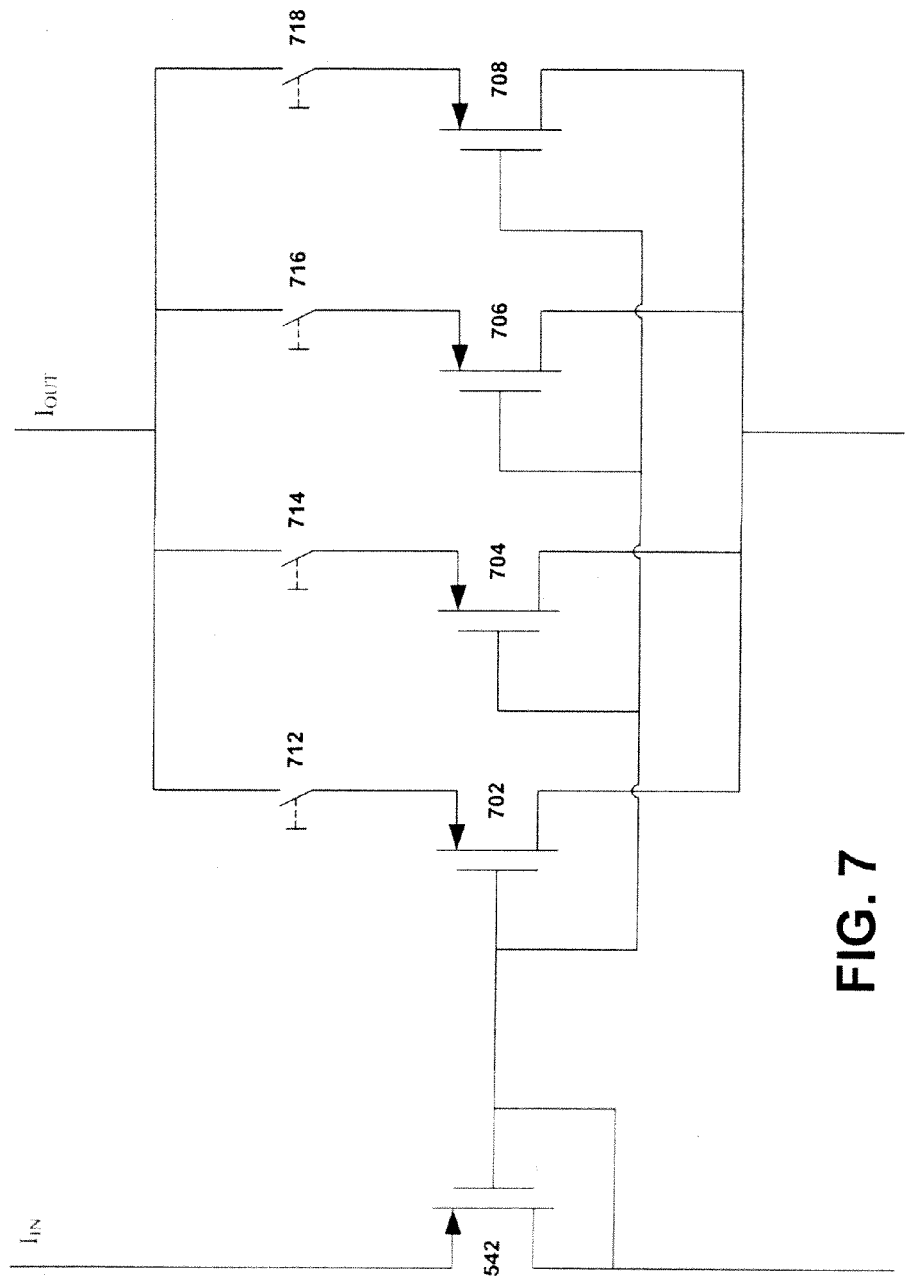
FIG. 7 illustrates an adjustable variant of a current mirror.

FIG. 7 illustrates an adjustable variant of a current mirror. Like current mirror 540 shown in FIG. 5, the current comprises PFET 542 with a source connected to ground. However PFET 544 is replaced by a plurality of PFETs connected in parallel, shown as four PFETs namely, PFETs 702, 704, 706 and 708. The current mirror can be programmed by setting switches 712, 714, 716 and 718. PFETs 702, 704, 706 and 708 can be of different sizes so they have different impedances. In this way, $I_{OUT}$ is proportional to $I_{IN}$ rather than equal to $I_{IN}$ with a proportion set by switches 712, 714, 716 and 718. Because the proportion of current that is mirrored by this current mirror can be chosen, the rise time of the reference voltage can be chosen by programming setting switches 712, 714, 716 and 718 as desired.

Reference voltage generator 500 has many advantages including the elimination of corners at startup. In addition, there are no switches so the transition between the positive feedback and the shutting down of current mirror 540 is performed smoothly without the need for additional circuitry to monitor the voltage. However, for noise or other considerations, it may be desirable once the desired reference voltage is attained to "switch over" directly to the desired reference voltage source.

Figure 8:
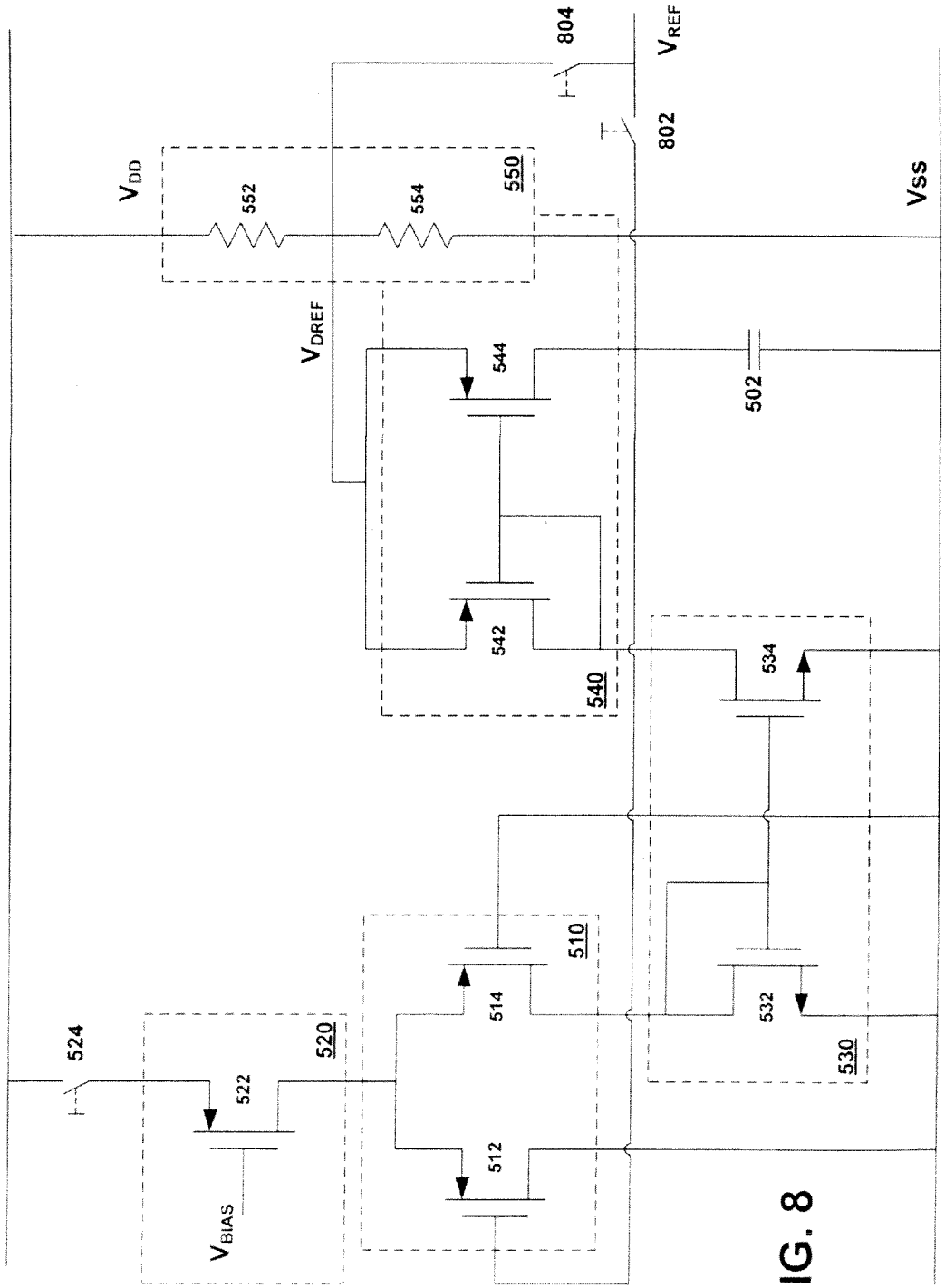
FIG. 8 shows an alternate embodiment of the reference voltage circuit with smooth ramp up.

FIG. 8 shows an alternate embodiment of the reference voltage generator. The circuit is similar to reference voltage generator 500, but further comprises switch 802 and 804. Prior to ramp up, switch 802 is closed and switch 804 is open. In this configuration, the circuit functions in a similar manner as described for reference voltage generator 500. Once reference voltage generator 500 has attained the desired reference voltage, switch 802 can be opened and switch 804 can closed so that desired reference voltage source 550 rather than capacitor 502 provides the reference voltage.

The reduction or elimination of pop eliminates a chief nuisance facing a listener of audio either in the form of voice or music. Audio drivers such as that described in FIG. 1 can benefit greatly from the inclusion of the reference circuit generator. These audio drivers are integral to a wide variety of electronic devices including but not limited to personal computer sound cards, voice-over-IP telephones, cellular telephones, digital picture frames, universal serial bus headsets, televisions, video game consoles, MP3 players and Bluetooth headsets.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. A circuit comprising:
a capacitor for providing a reference voltage;
a differential pair driven by a current source, having a first input controlling a first current and a second input, said first input for receiving the reference voltage and said second input for receiving a low supply voltage; and
a current mirror operable to generate a second current as a mirror of the first current, the second current configured to charge the capacitor, said current mirror coupled to the reference voltage and a predetermined voltage and configured to decrease the second current as the reference voltage approaches the predetermined voltage.

2. The circuit of claim 1 further comprising a second current mirror operable to mirror a third current controlled by the second input into a fourth current, wherein the current mirror is operable to mirror the fourth current into the second current, whereby the second current is a mirror of the third current.

3. The circuit of claim 2 wherein the second current mirror comprises a first n-channel FET (NFET) having a drain coupled to a gate and a second NFET having a gate coupled to the gate of the first NFET.

4. The circuit of claim 3 further comprising a fixed current source, the fixed current source comprises a first FET coupled to a fixed bias voltage;
the differential pair comprises a second FET comprising the first input and controlling the first current, and a third FET comprising the second input and controlling a third current; and the current mirror comprises a first PFET having a drain coupled to a gate and a second PFET having a gate coupled to the gate of the first PFET.

5. The circuit of claim 1 further comprising a fixed current source.

6. The circuit of claim 5 wherein the fixed current source comprises a field effect transistor (FET) coupled to a fixed bias voltage.

7. The circuit of claim 1 wherein the differential pair comprises a first FET comprising the first input and controlling the first current, and a second FET comprising the second input and controlling a third current.

8. The circuit of claim 1 wherein the current mirror comprises a first p-channel FET (PFET) having a drain coupled to a gate and a second PFET having a gate coupled to the gate of the first PFET.

9. An electronic device comprising:
an audio driver comprising:
a differential amplifier using a reference voltage as a ground reference;
an output stage:
a capacitor providing the reference voltage;
a differential pair driven by a current source, having a first input and a second input controlling a first current, said first input receiving the reference voltage and said second input receiving a low supply voltage; and
a current mirror operable to generate a second current as a mirror of the first current, the second current charges the capacitor, the current mirror coupled to the reference voltage and the predetermined voltage and configured to decrease the second current as the reference voltage approaches the predetermined voltage.

10. The electronic device of claim 9 further comprising a fixed current source, the fixed current source comprises a first FET coupled to a fixed bias voltage.

11. The electronic device of claim 9 wherein the differential pair comprises a first FET comprising the first input and controlling a third current, and a second FET comprising the second input and controlling the first current.

12. The electronic device of claim 9 wherein the current mirror comprises a first PFET having a drain coupled to a gate and a second PFET having a gate coupled to the gate of the first PFET.

13. The electronic device of claim 9 wherein the audio driver is disposed within one of a personal computer sound cards, a voice-over-IP telephone, a cellular telephone, a digital picture frame, a universal serial bus headset, a television, a video game console, an MP3 players or a Bluetooth headsets.

14. A method of controlling a voltage comprising:
dividing a current between a first current path having a first current and a second current path having a second current;
controlling the first current and the second current in response to a reference voltage, wherein the first current decreases and the second current increases when the reference voltage increases; and
generating a third current on the basis of the second current and the reference voltage comprising:
mirroring the second current into the third current and reducing the third current to zero as the reference voltage approaches a predetermined voltage; and
charging a capacitor using the third current, said capacitor providing the reference voltage.

15. The method of claim 14 wherein generating the third current comprises mirroring the second current into a fourth current.

16. The method of claim 14 wherein generating the third current comprises generating the third current on the basis of the fourth current and the reference voltage.

17. The method of claim 14 wherein the generating a third current comprises receiving by a current mirror the second current; wherein the current mirror is coupled to the predetermined voltage and the reference voltage.

18. The method of claim 14 wherein the generating the third current further comprises receiving by a first current mirror the second current to generate a fourth current.

19. The method of claim 18 wherein generating the third current further comprises receiving by a second current mirror the fourth current.

20. The method of claim 19 wherein the second current mirror is coupled to the predetermined voltage and the reference voltage.

21. The method of claim 14 wherein the dividing a fixed current and the controlling the first current and the second current is performed by a differential pair coupled to the reference voltage.

* * * * *